(12) United States Patent
Koike et al.

(10) Patent No.: US 6,471,770 B2
(45) Date of Patent: Oct. 29, 2002

(54) METHOD OF MANUFACTURING SEMICONDUCTOR SUBSTRATE

(75) Inventors: Masayoshi Koike; Seiji Nagai, both of Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 09/748,234

(22) Filed: Dec. 27, 2000

(65) Prior Publication Data

US 2001/0017099 A1 Aug. 30, 2001

(30) Foreign Application Priority Data

Dec. 27, 1999 (JP) .......................................... 11-368752

(51) Int. Cl.⁷ .............................................. C30B 25/22
(52) U.S. Cl. ................. 117/97; 117/8; 117/92; 438/44; 438/46
(58) Field of Search ................ 117/8, 92, 97; 438/44, 46

(56) References Cited

U.S. PATENT DOCUMENTS

| | | | |
|---|---|---|---|
| 5,846,844 A | | 12/1998 | Akasaki et al. |
| 6,117,700 A | * | 9/2000 | Orita et al. .................... 438/46 |
| 6,294,440 B1 | * | 9/2001 | Tsuda et al. .................. 438/46 |
| 6,342,404 B1 | * | 1/2002 | Shibata et al. ................ 438/46 |

FOREIGN PATENT DOCUMENTS

| | | |
|---|---|---|
| JP | 7-202265 | 8/1995 |
| JP | 10-312971 | 11/1998 |

\* cited by examiner

*Primary Examiner*—Felisa Hiteshew
(74) *Attorney, Agent, or Firm*—Pillsbury Winthrop LLP (57) ABSTRACT

A thick GaN layer is grown on sapphire through an Au layer at a temperature lower than the melting point of 1064° C. of the Au layer, and temperature of a sample is raised to reach and exceed the melting point of the Au layer so that the Au layer is dissolved. In this state, the sapphire and GaN layer are separated from each other.

10 Claims, 5 Drawing Sheets

METHOD OF MANUFACTURING SEMICONDUCTOR SUBSTRATE

BACKGROUND OF THE INVENTION

1. Field of the Invention

This invention relates to a method of manufacturing a semiconductor substrate. This invention is preferably adopted as a method of manufacturing a substrate of group III nitride compound semiconductor such as GaN.

The present application is based on Japanese Patent Application No. Hei. 11-368752, which is incorporated herein by reference.

2. Description of the Related Art

Traditionally, a substrate of a single crystal which cannot be used, as it is, as a substrate crystal has been formed in such a manner that crystal growth is made, directly or through various buffer layers, on a material (base material or substrate) having relatively similar characteristics in terms of the melting point, thermal expansion coefficient, lattice constant, etc., and thereafter the substrate is removed by grinding.

JP-A-7-202265 discloses a technique in which an intermediate layer located between a sapphire substrate and an GaN layer is dissolved and removed in a manner being immersed in an etchant at 60° C. after the GaN layer has been formed.

However, occasionally, the thermal expansion coefficient of the base material is different from that of the crystal grown thereon. This produces a warp or crack due to thermal distortion in a process of cooling from the crystal growth temperature at a high temperature to room temperature so that the single crystal substrate with high quality cannot be formed.

Figure 1:
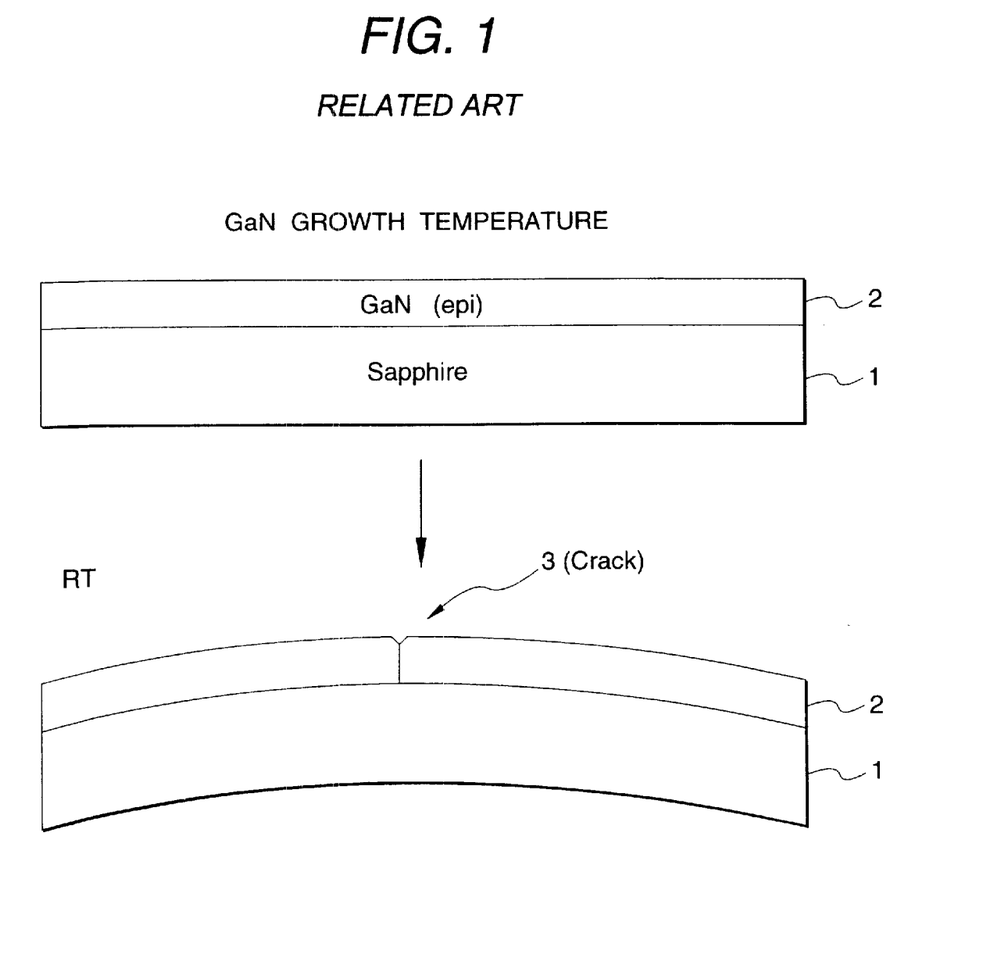
FIG. 1 is a schematic view showing the production of distortion due to a difference between a substrate and a semiconductor layer in their thermal expansion coefficients.

As for GaN, traditionally, after the GaN was grown on a substrate of sapphire at about 1000° C., the temperature was lowered to room temperature and the substrate thus formed was taken out from a reacting chamber. Now, the thermal expansion coefficients of sapphire and GaN are $7.5 \times 10^{-6}$ and $5.59 \times 10^{-5}$, respectively. Such a difference in the thermal expansion coefficient may produce a warp and further crack 3 when thick GaN 2 is epitaxially grown on the substrate 1 as shown in FIG. 1. Since the thermal expansion coefficient of the substrate is larger than that of GaN, contractive distortion is applied to GaN. Thus, lowering the temperature of a sample exerts an adverse effect on the crystallinity of the GaN.

It is difficult to acquire the substrate of GaN by removing the substrate from the warped sample through grinding. Even if this substrate is acquired, it could not have good quality since it has been subjected to stress during temperature lowering.

SUMMARY OF THE INVENTION

This invention has been accomplished in order to obviate the disadvantages described above.

In accordance with the first aspect of this invention, there is provided a method of manufacturing a semiconductor substrate comprising:

forming a semiconductor layer on a first layer through a second layer in a first environment; and separating the semiconductor layer in a second environment which is different from the first environment, the second environment lowering a coupling force of the second layer for at least one of the first layer and the semiconductor layer, or after having undergone the second environment, wherein distortion is not substantially applied to the semiconductor layer owing to a difference between itself and the first layer in their thermal expansion coefficient.

In accordance with the method of manufacturing a semiconductor substrate of this invention, since the coupling force of the second layer located between the semiconductor layer and the first layer which is a substrate has been reduced in the second environment, the semiconductor layer can be easily separated from a sample. Further, for the time from the first environment to the second environment, preferably until the semiconductor layer is separated after it has been formed, distortion is not substantially applied to the semiconductor layer owing to a difference in the thermal expansion coefficient. Therefore, the crystallinity of the semiconductor layer during the crystal growth is kept at the worst. Thus, the semiconductor substrate with good quality can be easily acquired.

Where the second layer that has once experienced the second environment does not restore the coupling force for at least one of the first layer and semiconductor layer regardless of the subsequent environment, i.e. where the coupling force of the second layer for at least one of the first layer and semiconductor layer which has been once reduced or become zero is kept, it is not necessary to separate the semiconductor layer in the second environment.

The materials of the first layer which is a substrate and second layer which is an intermediate layer may be optionally selected in accordance with the semiconductor to be grown.

Where the semiconductor to be grown is Group III nitride compound semiconductor such as GaN, the material of the substrate maybe sapphire, spinel, silicon, silicon carbide, zinc oxide, gallium phosphide, gallium arsenide, magnesium oxide, manganese oxide, etc.

According to the investigation by the inventors of this invention, preferably, the substrate is made of sapphire and the plane a is used.

The second layer which is an intermediate layer is made of a material having reduced coupling force for at least one of the first layer and the semiconductor layer. In order to isolate the semiconductor layer, the coupling force of the second layer for the semiconductor layer is preferably reduced.

Where the first environment where the semiconductor layer is grown and the second environment where the second layer is made fragile are different in their physical environmental conditions, particularly the temperature conditions, as the material of the second layer, metal whose melting point is higher than the growth temperature of the semiconductor layer (temperature of the first environment) and not higher than the temperature of the second environment is selected. Such a metal may be Ti, Ni, Y, Be, Mn, Au, Ag, Cu and their alloy. On the other hand, where the first environment and the second environment are different in their chemical conditions, i.e. the second layer is chemically resolved or dissolved in the second environment, the material of the second layer may be ZnO, etc.

These layers are formed by known techniques such as vacuum deposition and sputtering. The thickness of the second layer is not limited particularly. For example, it may be 10–10000 nm, preferably 100–5000 nm.

It is not required that the second layer is formed on the entire first layer. For example, when Group III nitride compound semiconductor is grown by the lateral growth technique (ELO method: epitaxial lateral over growth) as disclosed in JP-A-10-312971, the second layer is formed on the first layer which is exposed among growth inhibiting materials.

The material of the semiconductor layer is not particularly limited as long as it is required as a single crystal substrate. Preferably, the semiconductor may be made of the Group III nitride compound semiconductor. Now, the Group III nitride compound semiconductor can be represented by a general formulas $Al_xGa_yIn_{1-x-y}N$ ($0 \leq X \leq 1$, $0 \leq Y \leq 1$, $0 \leq X+Y \leq 1$), and it includes a "binary system" of AlN, GaN and InN and a "ternary system" of $Al_xGa_{1-x}N$, $Al_xIn_{1-x}N$ and $Ga_xIn_{1-x}N$ ($0 \leq X \leq 1$). Boron (B), thallium (Tl), etc may be substituted for apart of the Group III element. Phosphorus (P), arsenic (As), antimony (Sb), bismuth(Bi), etc may be substituted for a part of nitrogen (N).

The Group III nitride compound semiconductor layer may contain any dopant. An n-type impurity may be Si, Ge, Se, Te, C, etc. A p-type impurity may be Mg, Zn, Be, Ca, Sr, Ba, etc. The Group III nitride compound semiconductor, after having been doped with the p-type impurity, may be exposed to electron beam radiation, plasma radiation or furnace heating.

The method of forming the Group III nitride compound semiconductor layer is not particularly limited. The Group III nitride compound semiconductor layer may be formed by not only an organic metal chemical vapor deposition (MOCVD) but also the molecular beam crystal growth (MBE), halide vapor growth (HVPE), sputtering, ion-plating, electron shower, etc. A buffer layer may be preferably formed between the second layer and the semiconductor layer.

Since the semiconductor layer, after having been separated, is used, it must have a certain film thickness.

Generally, the substrate is required to have a film thickness of 100 μ or more.

In order to prevent the distortion due to the thermal expansion coefficient from being applied to the semiconductor layer, the first environment, i.e. the temperature of the growth of the semiconductor layer and the temperature of the second environment are made equal to each other. According to the investigation by the inventors of this invention, if the temperature difference between the first environment and the second environment is within 50% in terms of the absolute temperature of the former, the distortion is not substantially applied to the semiconductor layer. Preferably, it is within 30%, and more preferably it is within 20%.

The method for separating the semiconductor layer is not particularly limited. In a state where the coupling force of the second layer has been reduced, loads in opposite directions are applied to the first layer which is a substrate and the semiconductor layer so that they are sheared from each other. Otherwise, they are cut at the second layer using a knife. In some cases, thermal distortion when the sample is cooled may be concentrated on the second layer so that they are automatically separated from each other at the second layer.

As long as the coupling force of the second layer for the semiconductor layer has been reduced, the semiconductor layer can be isolated during the separating. Where the coupling force of the second layer has been reduced for the first layer which is the substrate, the second layer is deposited on the semiconductor layer.

The semiconductor layer thus separated can be applied as a semiconductor substrate to various semiconductor elements. These semiconductor elements include not only an optical element such as a light emitting diode, a light receiving diode, a laser diode, a solar cell, etc. but also a bipolar element such as a rectifier, a thyristor, a transistor, etc. a unipolar element such as an FET and an electronic device such as a microwave element. This invention maybe also applied to a laminate which is an intermediate of these elements.

Incidentally, the light emitting element may have a homo-structure, a hetero-structure or double-hetero-structure including an MIS junction, PIN junction or pn junction. The light emitting layer may have a quantum well structure (single quantum well structure or multi-quantum well structure).

The inventors of this invention proposes the following invention according to the second aspect.

A method of manufacturing a semiconductor substrate comprising;

forming a semiconductor layer on a first layer through a second layer, and separating the semiconductor layer, thereby forming the semiconductor substrate inclusive of the semiconductor layer, wherein the second layer is composed of a distortion absorbing layer having a first melting point and an underlying layer having a second melting point, higher than the first melting point, the distortion absorbing layer being in a dissolved state at a temperature of an environment where the semiconductor layer is formed.

In accordance with the invention according to the second aspect, the second layer which is an intermediate layer is composed of a distortion absorbing layer and an underlying layer. The distortion absorbing layer is in a dissolved state at a temperature of growing the semiconductor layer, i.e. the first environment, and hence has substantially zero coupling force for the first layer. However, this does not affect the growth of the semiconductor layer since the underlying layer is made of a refractory material (having a higher melting point than the semiconductor growth temperature).

However, from the standpoint of view of using the crystal structure of the first layer which is the substrate, it is preferred that the semiconductor layer is initially grown at the temperature lower than the melting point of the distortion absorbing layer and thereafter the temperature is raised to dissolve the distortion absorbing layer. In this case, the first layer and the semiconductor layer are separated from each other before the distortion absorbing layer is solidified. Further, even when the semiconductor layer is not separated, the distortion absorbing layer is in a dissolved state for a short while during temperature lowering. Therefore, the distortion stress due to the difference between the first layer and the semiconductor layer in their thermal expansion coefficients is relaxed at this time. Thus, the warp or crack is not generated in the semiconductor layer. After cooling, if the temperature of the sample is raised by a hot plate or the like, the distortion absorbing layer is fallen in the dissolved state again. Therefore, the first layer and the second layer can be easily separated.

When the distortion absorbing layer is separated in this way, the underlying layer is deposited on the semiconductor layer. For this reason, it is desired that the underlying layer is made thin so that where there is a difference between itself and the semiconductor layer, the crack is generated preferentially in this underlying layer.

DETAILED DESCRIPTION OF THE PREFERRED EMBODIMENTS

An explanation will be given of embodiments of this invention.

Figure 2:
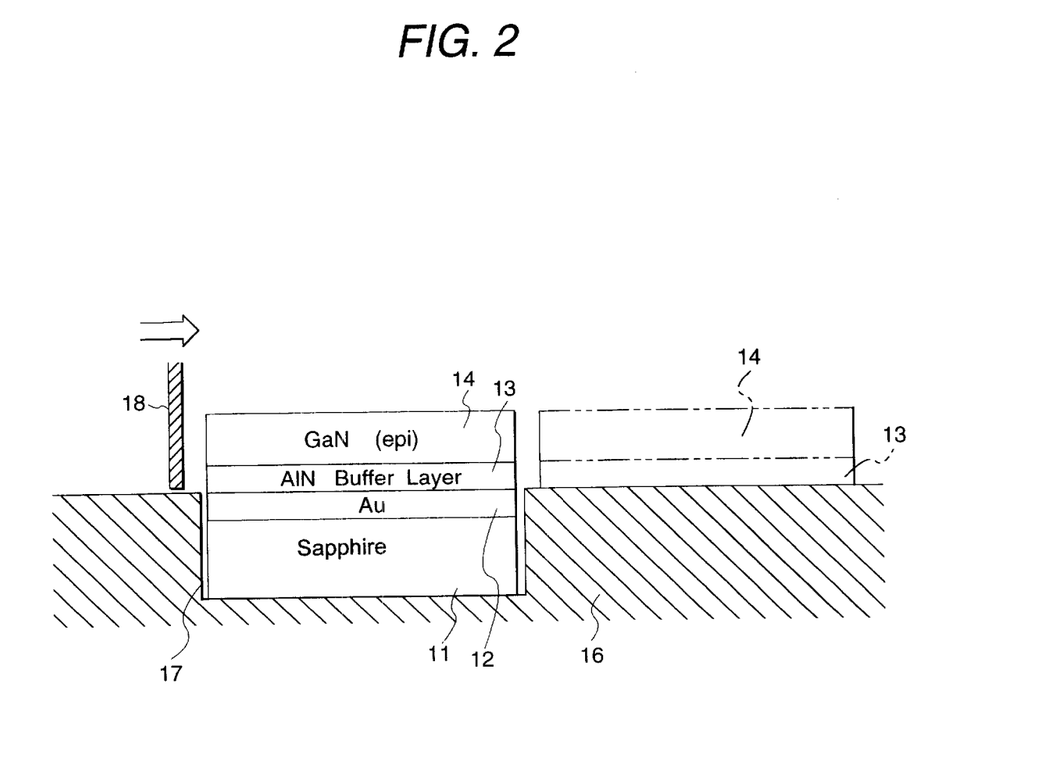
FIG. 2 is a schematic view showing a manufacturing method according to the first embodiment of this invention.

Embodiment 1 (FIG. 2)

An Au layer having a thickness of 3 $\mu$m (melting point: 1064° C.) which is a second layer is formed by sputtering on the surface (plane a) of sapphire substrate 11 which is a first layer. The substrate thus obtained is mounted in a susceptor of an MOCVD apparatus. A concave portion 17 for receiving a sample is formed in the susceptor 16. The depth of the concave portion 17 is set so that the upper surface of the Au layer 12 is substantially flush with that of the susceptor 16 in the state where the sample has been mounted.

An AlN buffer layer 13 having a thickness of 100 nm is grown on the Au layer 12 at a growth temperature of 400° C. The layers as far as this buffer layer 13 can be formed by sputtering. Incidentally, it should be noted that as the buffer layer 13, the other Group III nitride compound semiconductor such as GaN or ZnO may be used.

Subsequently, a GaN layer 14 having a thickness of about 100 $\mu$m is epitaxially grown at a growth temperature of 1000° C. The environment (first environment) where the GaN is grown is the same as that when the ordinary MOCVD method is executed except that the growth temperature must be set at a temperature lower than the melting point of Au.

Thereafter, the temperature of the sample is raised to dissolve the Au layer 12 (second environment). The temperature raising of the sample is carried out by raising the temperature of the susceptor 16. In this case, the temperature of the sample is set for the temperature where the GaN layer 14 is not resolved and the thermal distortion of the sapphire substrate 11 and the GaN layer is negligible. In this embodiment, the temperature of the sample is raised to 1100° C.

After the Au layer 12 is dissolved, the GaN layer 14 and sapphire 11 are sheared. In this embodiment, a blade 18 arranged in an MOCVD reacting chamber is moved in parallel onto the upper surface of the susceptor 16 so that the GaN layer 14 is separated from the sapphire substrate 11. With the blade 18 being fixed, the susceptor 16 may be moved. Both may be moved. The upper surface of the susceptor 16 is preferably surface-treated so that the stack of the AlN 13–GaN 14 is easy to slide.

Figure 3:
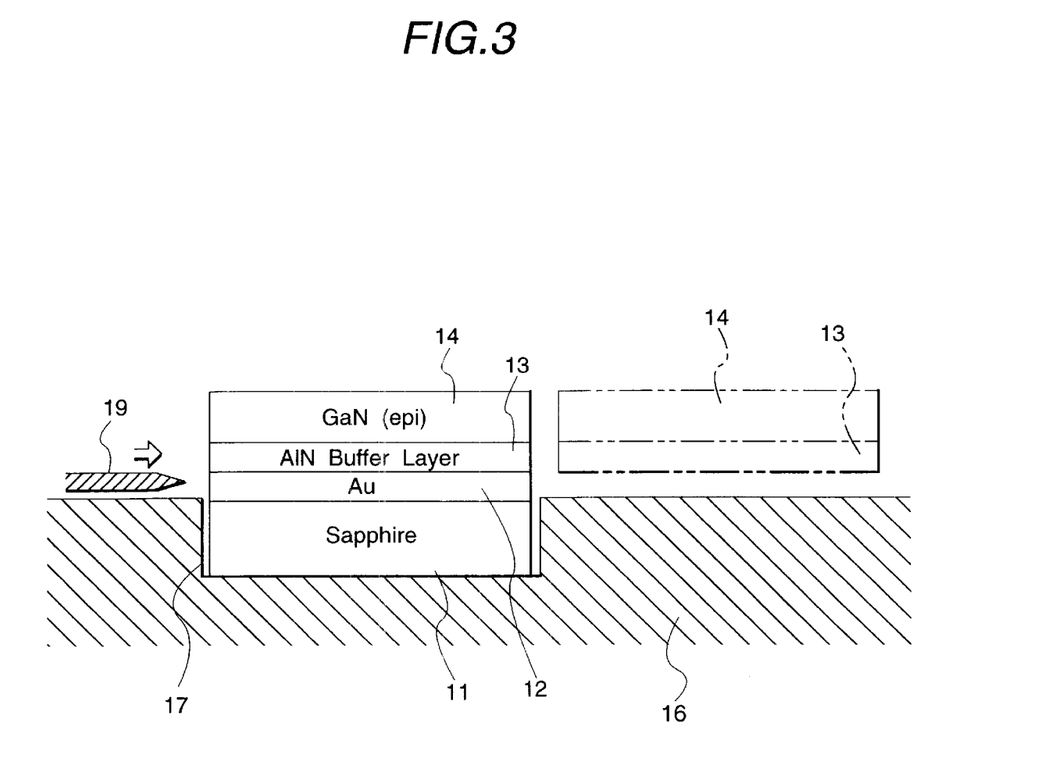
FIG. 3 is a schematic view showing a modification of the manufacturing method according to the first embodiment of this invention.

Instead of the blade 18, as shown in FIG. 3, a knife 19 can be provided to cut the Au layer 12 in the dissolved state. In this case, the upper surface of the susceptor 16 is set to be substantially flush with that of the sapphire substrate 11.

In the case of using the knife 19, the concave portion 17 can be omitted from the susceptor 16.

Figure 4:
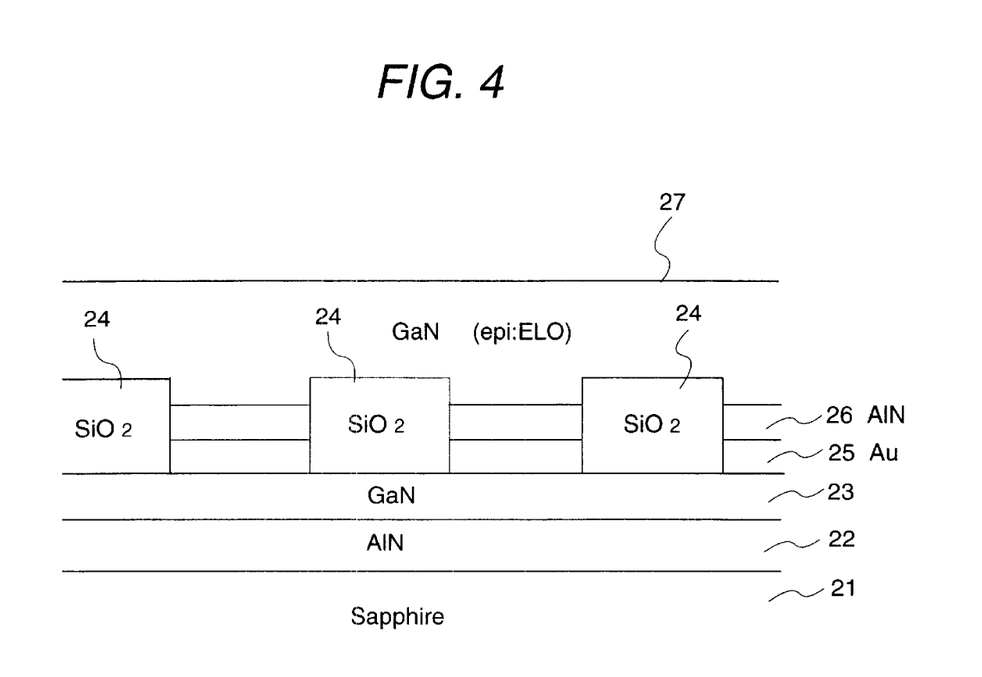
FIG. 4 is a schematic view showing a manufacturing method according to the second embodiment and construction of a sample before a silicon substrate and a GaN layer are separated from each other.

Embodiment 2 (FIG. 4)

This embodiment intends to improve the crystallinity of the semiconductor layer using the ELO technique.

On the surface (plane a) of a sapphire substrate 21 which is a first layer, an AlN buffer layer 22 (10 nm thick) and GaN layer 23 (10 $\mu$m thick) are usually formed by the MOCVD technique. Thereafter, an SiO$_2$ layer is formed on the GaN layer 23. The SiO$_2$ layer is patterned into SiO$_2$ stripes 24. With the upper surface of each of the SiO$_2$ stripes 24 being masked, an Au layer 25 is formed on the GaN layer 23 by sputtering.

The sample is moved into the reacting chamber of the MOCVD apparatus again. As in the first embodiment, an AlN layer 26 (10 nm thick) is formed at a reacting temperature of 400° C. Further, a GaN layer 27 is epitaxially grown at a reacting temperature raised to 1000° C. In this case, the GaN layer is initially grown to develop a facet structure among the SiO$_2$. As the growth advances, GaN is embedded in the facet structure to form a flat layer of GaN. Incidentally, the SiO$_2$ stripes 24 and Au layer 25 can be directly formed on the sapphire substrate 21 without forming the buffer layer 22 and GaN layer 23.

After the GaN layer has been grown by the ELO technique, the temperature of the sample is raised to 1100° C. to dissolve the Au layer 25. Since Group III nitride compound semiconductor is not grown on SiO$_2$, coupling forces between the SiO$_2$ stripes 24 and Al layer 26 as well as between the SiO$_2$ stripes 24 and GaN layer 27 are approximately zero. Therefore, when opposite loads in a direction along the SiO$_2$ stripes 24 are applied to the sapphire substrate 21 and GaN layer, both will be separated from each other.

Figure 5:
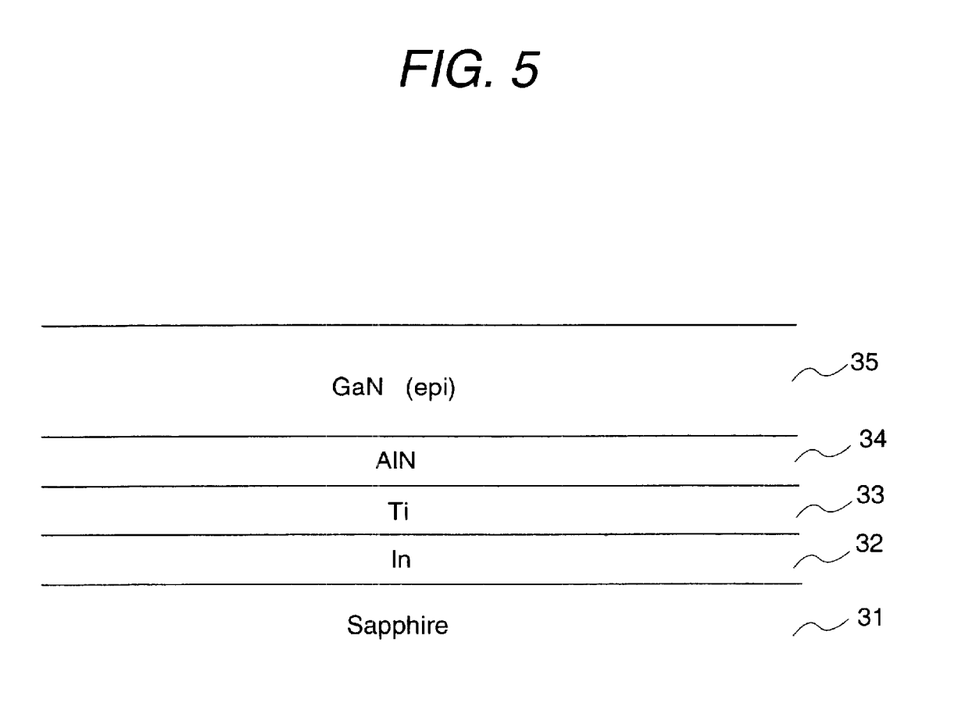
FIG. 5 is a schematic view showing a manufacturing method according to the third embodiment and construction of a sample before a silicon substrate and a GaN layer are separated from each other.

Embodiment 3 (FIG. 5)

This embodiment corresponds to the second aspect of this invention.

On the surface (plane a) of a sapphire substrate 31 which is a first layer, an In layer 32 (3 $\mu$m thick) having a low melting point of 157° C. which serves as a distortion absorbing layer is formed by sputtering. Thereafter, on the upper surface of the In layer 32, a Ti layer 33 (1 $\mu$m thick) having a high melting point of 1660° C. which serves as an underlying layer is also formed by sputtering. The In layer 32 and Ti layer 33 constitute a second layer (intermediate layer). Next, the sample is moved into the reacting chamber of the MOCVD apparatus. An AlN layer 34 (20 nm thick) which serves as a buffer layer is formed on the Ti layer 33 by the MOCVD technique. Subsequently, a GaN layer 35 is epitaxially grown on the AlN layer 34.

In this embodiment, while the GaN layer 35 is grown, the In layer 32 is dissolved. After the growth of the GaN layer 35 has been completed, the temperature of the sample is lowered and the In layer 32 is maintained in the dissolved state. Therefore, the distortion of the sapphire substrate 31 and GaN layer 35 due to the difference in their thermal expansion coefficients is absorbed and relaxed by the In layer 32. Thus, even when the temperature of the sample is lowered to room temperature, neither warp nor crack is produced in the GaN layer.

Thereafter, if the sample whose temperature has been lowered to room temperature is heated again using e.g. a hot plate, the In layer 32 is dissolved. In this state, the sapphire substrate 31 and GaN layer 35 are sheared, or otherwise cut by knife at the In layer 32 so that they are easily separated from each other.

While the In layer 32 is in the dissolved state before the temperature of the sample is lowered to room temperature, in the same manner as in the first embodiment, the sapphire substrate 31 and GaN layer 35 can be separated within the MOCVD apparatus.

This invention should not be limited to the mode of carrying out this invention and the embodiments described above. Various modifications can be included in this invention within a range which can be easily realized by those skilled in the art without departing from the spirit of the scope of claim.

The following items are disclosed.

(11) A semiconductor growth device provided with means for shearing a first layer and a semiconductor layer at a second layer.

(12) A semiconductor growth device according to item (11) which is an MOCVD apparatus having a susceptor having a concave portion in which the first layer is inserted.

(13) A semiconductor growth device according to item (12) wherein a blade in contact with the semiconductor layer is provided in the MOCVD apparatus, and means for moving the blade relatively in parallel to the upper surface of the susceptor.

(14) A semiconductor growth device provided with a knife for cutting a second layer.

(21) An element including a semiconductor substrate formed according to the methods disclosed in the specification and drawings.

(31) A laminate composed of a first layer, a second layer and a semiconductor layer which are successively stacked, wherein the first layer and semiconductor layer have different thermal expansion coefficients, and in the second environment different from the first environment when the semiconductor layer is formed, the second layer has reduced or zero coupling force for at least one of the first layer and the semiconductor layer.

(32) A laminate according to item (31), wherein the second layer is solid in the first environment and dissolved in the second environment.

(33) A laminate according to item (31), wherein the second layer is selectively resolved or dissolved in the second environment.

(34) A laminate according to item (31), wherein the first layer is a sapphire substrate, the semiconductor layer is Group III nitride compound semiconductor, and the second layer is a metal. which is in a solid state at a temperature of the first environment and is in a dissolved state at a temperature of the second environment.

(35) A laminate composed of a first layer, a second layer and a semiconductor layer which are successively stacked, wherein the first layer and the semiconductor layer have different thermal expansion coefficients, and the second layer is composed of a distortion absorbing layer on the side of the first layer and an underlying layer having a high melting point, the distortion absorbing layer being in a dissolved state at a temperature of an environment where the semiconductor layer is formed.

(37) A laminate according to item (35), wherein the first layer is a sapphire substrate, the distortion absorbing layer of the second layer is made of In, the underlying layer thereof is made of Ti, and the semiconductor layer is made of Group III nitride compound semiconductor.

(41) A laminate composed of the first layer and the second layer according to any one of items (31) to (37).

What is claimed is:

1. A method of manufacturing a semiconductor substrate, comprising:

forming a semiconductor layer on a first layer through a second layer in a first environment; and separating said semiconductor layer in a second environment or after having undergone the second environment which is different from the first environment, a coupling force of said second layer with respect to at least one of said first layer and said semiconductor layer being lowered in the second environment, wherein distortion is not substantially applied to said semiconductor layer owing to a difference between itself and said first layer in their thermal expansion coefficient.

2. A method of manufacturing a semiconductor substrate according to claim 1, wherein a material of said second layer is solid in said first environment and is dissolved in said second environment.

3. A method of manufacturing a semiconductor substrate according to claim 1, wherein said second environment causes said second layer to be selectively dissolved or resolved.

4. A method of manufacturing a semiconductor substrate according to claim 1, wherein said first layer is a sapphire substrate, said semiconductor layer is Group III nitride compound semiconductor, and said second layer is a metal which is in a solid state at a temperature of said first environment and is in a dissolved state at a temperature of said second environment.

5. A method of manufacturing a semiconductor substrate, comprising:

forming a semiconductor layer on a first layer through a second layer, and separating said semiconductor layer, thereby forming the semiconductor substrate inclusive of said semiconductor layer, wherein said second layer comprises a distortion absorbing layer having a first melting point and an underlying layer having a second melting point higher than the first melting point, said distortion absorbing layer being in a dissolved state at a temperature of an environment where said semiconductor layer is formed.

6. A method of manufacturing semiconductor substrate according to claim 5, wherein said semiconductor layer is initially grown at a temperature lower than the first melting point and thereafter grown at a temperature not lower than the first melting point and lower than the second melting point.

7. A method of manufacturing a semiconductor substrate according to claim 6, wherein said first layer is a sapphire substrate, said distortion absorbing layer of said second layer is made of In, said underlying layer thereof is made of Ti, and said semiconductor layer is made of Group III nitride compound semiconductor, and said semiconductor layer is initially grown at a substrate temperature lower than the first melting point, thereafter grown at a substrate temperature not lower than the first melting point and lower than the second melting point, and is separated from said first layer after temperature lowering.

8. A method of manufacturing a semiconductor substrate according to claim 5, wherein said first layer is a sapphire substrate, said distortion absorbing layer of said second layer is made of In, said underlying layer thereof is made of Ti, and said semiconductor layer is made of Group III nitride compound semiconductor, and said semiconductor layer is initially grown at a substrate temperature lower than the first melting point, thereafter grown at a substrate temperature not lower than the first melting point and lower than the second melting point, and is separated from said first layer after temperature lowering.

9. A method of manufacturing a semiconductor substrate according to claim 7, wherein said semiconductor layer is separated from said sapphire substrate in a state where said distortion absorbing layer is dissolved.

10. A method of manufacturing a semiconductor substrate according to claim 7, wherein said semiconductor layer is separated from said sapphire substrate after the substrate temperature has been lowered to room temperature.

* * * * *